(12) United States Patent
Voldman

(10) Patent No.: US 7,102,867 B2
(45) Date of Patent: Sep. 5, 2006

(54) METHOD, APPARATUS AND CIRCUIT FOR LATCHUP SUPPRESSION IN A GATE-ARRAY ASIC ENVIRONMENT

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,176

(22) Filed: Jun. 30, 2003

(65) Prior Publication Data

US 2004/0262643 A1 Dec. 30, 2004

(51) Int. Cl.
*H02H 9/02* (2006.01)
*H02H 3/08* (2006.01)

(52) U.S. Cl. .................................... 361/93.1
(58) Field of Classification Search ............... 361/91.1, 361/90, 111; 326/15, 83
See application file for complete search history.

(56) References Cited

U.S. PATENT DOCUMENTS

| | | | | |
|---|---|---|---|---|
| 4,701,777 A | | 10/1987 | Takayama et al. ............ 357/42 |
| 4,740,827 A | | 4/1988 | Niitsu et al. .................. 357/42 |
| 4,905,199 A | * | 2/1990 | Miyamoto .................. 365/226 |
| 5,530,394 A | * | 6/1996 | Blossfeld et al. ........... 327/530 |
| 5,635,744 A | | 6/1997 | Hidaka et al. ............... 257/349 |
| 5,637,900 A | | 6/1997 | Ker et al. .................... 257/355 |
| 5,694,072 A | * | 12/1997 | Hsiao et al. ................. 327/537 |
| 5,742,465 A | * | 4/1998 | Yu .............................. 361/111 |
| 5,942,932 A | * | 8/1999 | Shen ........................... 327/530 |
| 6,043,522 A | | 3/2000 | Nakajima et al. ........... 257/206 |
| 6,054,344 A | | 4/2000 | Liang et al. ................. 438/223 |
| 6,228,726 B1 | | 5/2001 | Liaw ........................... 438/294 |
| 6,258,641 B1 | | 7/2001 | Wong et al. ................. 438/199 |
| 6,292,343 B1 | | 9/2001 | Pequignot et al. .......... 361/111 |
| 6,359,316 B1 | | 3/2002 | Voss et al. ................... 257/369 |
| 6,373,105 B1 | | 4/2002 | Lin ............................. 257/357 |
| 6,473,282 B1 | * | 10/2002 | Lin et al. ...................... 361/90 |
| 6,624,660 B1 | * | 9/2003 | Li et al. ........................ 326/83 |

FOREIGN PATENT DOCUMENTS

| | | |
|---|---|---|
| DE | 4108730 A1 | 9/1992 |
| GB | 2286289 A | 10/1996 |

OTHER PUBLICATIONS

Haseloff, Latch-Up, ESD and Other Phenomena, Application Report, Texas Instrument SLYA014A, May 2000, http:/www.ti.com, pp. 1-8.*

*Guard Ring Connection In CMOS Structures*; H. Hanafi, T. Ludwig, H. Schettler and O. Wagner, IBM Technical Disclosure Bulletin; vol. 27, No. 11, Apr. 1985; pp. 6806-6807.

* cited by examiner

*Primary Examiner*—Brian Sircus
*Assistant Examiner*—Z Kitov
(74) *Attorney, Agent, or Firm*—Downs Rachlin Martin PLLC

(57) ABSTRACT

An integrated circuit having a substrate (10), a power rail (18, 20), a sea of gates (12), and a latchup control isolation network electrically coupled to substrate (10). The latchup control isolation network electrically isolates sea of gates (12) from power rail (18, 20). In another embodiment, an active clamp network may be utilized to electrically isolate sea of gates (12) from power rail (18, 20). Substrate (10) includes a voltage potential. When the voltage potential is equal to or greater than a first predetermined value or the voltage potential is equal to or less than a second predetermined value, either the latchup control isolation network turns off or the active clamp network turns on thereby isolating sea of gates (12) from power rail (18, 20).

19 Claims, 7 Drawing Sheets

METHOD, APPARATUS AND CIRCUIT FOR LATCHUP SUPPRESSION IN A GATE-ARRAY ASIC ENVIRONMENT

BACKGROUND OF INVENTION

1. Field of the Invention

The present invention generally relates to latchup suppression integrated circuits, and more particularly to providing latchup suppression in a gate-array ASIC environment.

2. Background of the Invention

As the internal structures in integrated circuits are getting smaller, it is getting more difficult to control the phenomenon known as "latchup." Latchup occurs when a pnpn structure transitions from a low current high voltage state to a high current low voltage state through a negative resistance region (i.e., forming an S-Type I-V (current/voltage) characteristic). Latchup is an unwanted phenomenon in that it either completely destroys or severely impairs electronic components within an integrated circuit.

Latchup is typically understood as occurring within a pnpn structure, or silicon controlled rectifier (SCR) structure. Interestingly, pnpn structures may be both intentionally designed and unintentionally formed between structures. Hence, latchup conditions may occur within peripheral circuits or internal circuits, within one circuit (intra-circuit), or between multiple circuits (inter-circuit).

Latchup is typically initiated by an equivalent circuit of a cross-coupled pnp and npn transistor. With the base and collector regions being cross-coupled, current flows from one device leading to the initiation of the second device ("regenerative feedback"). These pnp and npn elements may be any diffusions or implanted regions of other circuit elements (e.g., p-channel MOSFETs, n-channel MOSFETs, resistors, etc.) or actual pnp and npn bipolar transistors. In CMOS, the pnpn structure may be formed with a p-diffusion in a n-well, and a n-diffusion in a p-substrate ("parasitic pnpn"). In this case, the well and substrate regions are inherently involved in the latchup current exchange between regions.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g., base width of the npn and base width of the pnp), current gain of the transistors, substrate resistance and spacings, the well resistance and spacings, and isolation regions.

Latchup is a concern in both internal circuits and peripheral circuitry. Latchup may also occur as the result of interaction of the ESD device, the I/O off-chip driver, and adjacent circuitry initiated in the substrate from overshoot and undershoot phenomenon. These may be generated by CMOS off-chip driver circuitry, receiver networks, and electrostatic discharge (ESD) devices. In CMOS I/O circuitry, undershoot and overshoot may lead to injection in the substrate. Hence, both a p-channel MOSFET and an n-channel MOSFET may lead to substrate injection. Simultaneous switching of circuitry, where overshoot or undershoot injection occurs, leads to injection into the substrate which leads to both noise injection and latchup conditions. Supporting elements in these circuits, such as pass transistors, resistor elements, test functions, over voltage dielectric limiting circuitry, bleed resistors, keeper networks, and other elements may be present leading to injection into the substrate. ESD elements connected to the input pad may also lead to latchup. ESD elements that may lead to noise injection and latchup include MOSFETs, pnpn SCR ESD structures, p+/n-well diodes, n-well-to-substrate diodes, n+ diffusion diodes, and other ESD circuits. ESD circuits may contribute to noise injection into the substrate and latchup.

An additional process may occur by the interaction of "activated" and "unactivated" elements in a gate-array environment. In an ASIC environment, a "sea of gates" philosophy allows customization and personalization of circuit elements at a metalization level where the silicon regions are predefined. Unused n-diffusion regions are grounded, and unused p-diffusion regions are connected to $V_{DD}$. Unfortunately, this implementation may lead to latchup. As the substrate voltage potential rises relative to the n-diffusion, all the elements of the gate arrays tend to forward bias. As the substrate voltage potential lowers, the unused p-diffusion elements, the n-well and the substrate may activate the vertical pnp. This may occur as a result of minority carrier injection in wells and substrate regions.

In an ASIC gate array environment, it has been observed that as a negative pulse is injected into an input pad, ESD current discharge to the substrate may flow outside of the I/O cell region, leading to "turn-on" of the adjacent gate array regions connected to the $V_{SS}$ and $V_{DD}$ rails. This often results in increasing the likelihood of latchup and leading to failure of the latchup specification.

An additional problem in latchup is the propagation of the latchup process once latchup is initiated in an array environment. As an initial source injects electrons into the substrate, a first circuit element may latchup. The latchup of a first circuit leads to the turn-on of a pnp parasitic element leading to more injection into the substrate. As a result, the injection into the substrate of the primary initial perturbation is additive by linearity to the secondary injection initiated by the circuit undergoing latchup. This leads to an adjacent circuit to also latchup as the total current of the initial primary injection current (which decreases with distance from initial injection point) is additive to the secondary. This leads to a propagation run-away effect leading to additional latchup propagation. Hence, the solution of detachment of the rails is a structure to "truncate the latchup propagation" through the semiconductor chip and array region.

Latchup may be initiated by negative transient on the $V_{DD}$ which may lead to a forward biasing of all the n-diffusions and n-well structures and electron injection throughout the semiconductor chip substrate. This produces a "sea of electrons" injected in the chip substrate. Equivalently, a positive transient on the $V_{SS}$ may lead to hole injection and forward biasing of the substrate-well junction providing a "sea of holes" event. In this event, it is possible the metric of how far the detachment is placed may be dependent on other physical parameters, such as the latchup sensitivity of the gate array element, circuit type (e.g., SRAM cell, logic gate, gate array MOSFET) based on the parasitic current gains, substrate, and well resistances.

Latchup may occur from voltage or current pulses that occur on the power supply lines, such as $V_{DD}$ and $V_{SS}$. Transient pulses on power rails (e.g., substrate or wells) may trigger latchup processes. The propagation of the impulse on the power grids may also be quantified and appropriate latchup control networks may be placed. Latchup may also occur from a stimulus to the well or substrate external to the region of the thyristor structure from minority carriers.

Latchup may be initiated from internal or external stimulus. Latchup is known to occur from single event upsets (SEU). Single event upsets may include terrestial emissions from nuclear processes, cosmic ray events, as well as events in space environments. Cosmic ray particles may include proton, and neutron, gamma events, as well as a number of particles that enter the earth atmosphere. Terrestial emissions from radioactive events, such as alpha particles, and other radioactive decay emissions, may also lead to latchup in semiconductors. In this case, it is possible that the methodology is applied to sensitive gate array circuits, as well as other circuits, such as pass transistors and SRAM cells. As applied to the gate array circuits, the SRAM power rails and ground rails may be decoupled to avoid latchup or SEU events. In this case, the methodology may be addressed by certain functional blocks instead of spatial dependence. Hence the methodology of detachment and connection to the latchup control networks may be according to the circuit type as well as physical localness (placement) to the injection source.

SUMMARY OF INVENTION

The present invention is a method and apparatus for improving the latchup tolerance of circuits embedded in an integrated circuit while avoiding direct electrical connection to power rails using circuit implementations for gate array environments.

One aspect of the invention is an integrated circuit having a substrate, a power rail, a sea of gates, and a latchup control isolation network electrically coupled to the substrate. The latchup control isolation network electrically isolates the sea of gates from the power rail.

Another aspect of the present invention is an integrated circuit having a substrate, a power rail, a sea of gates, and an active clamp network electrically coupled to the substrate. The active clamp network electrically isolates the sea of gates from the power rail.

Still another aspect of the present invention is a method of suppressing latchup in an integrated circuit in a substrate, the circuit having a sea of gates and a power rail. The method includes the following steps: electrically connecting a latchup control isolation network or an active clamp network to the substrate; and if the latchup control isolation network is electrically connected to the substrate, turning off the latchup control isolation network or if the active clamp network is electrically connected to the substrate turning on the active clamp network thereby isolating the power rail from the sea of gates.

Other features, utilities and advantages of various embodiments of the invention will be apparent from the following more particular description of embodiments of the invention as illustrated in the accompanying drawings.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

The present invention is an integrated circuit device and related method for improving the latchup tolerance of circuits by avoiding direct electrical connection to power rails when using circuit implementations including gate array environments.

Figure 1:
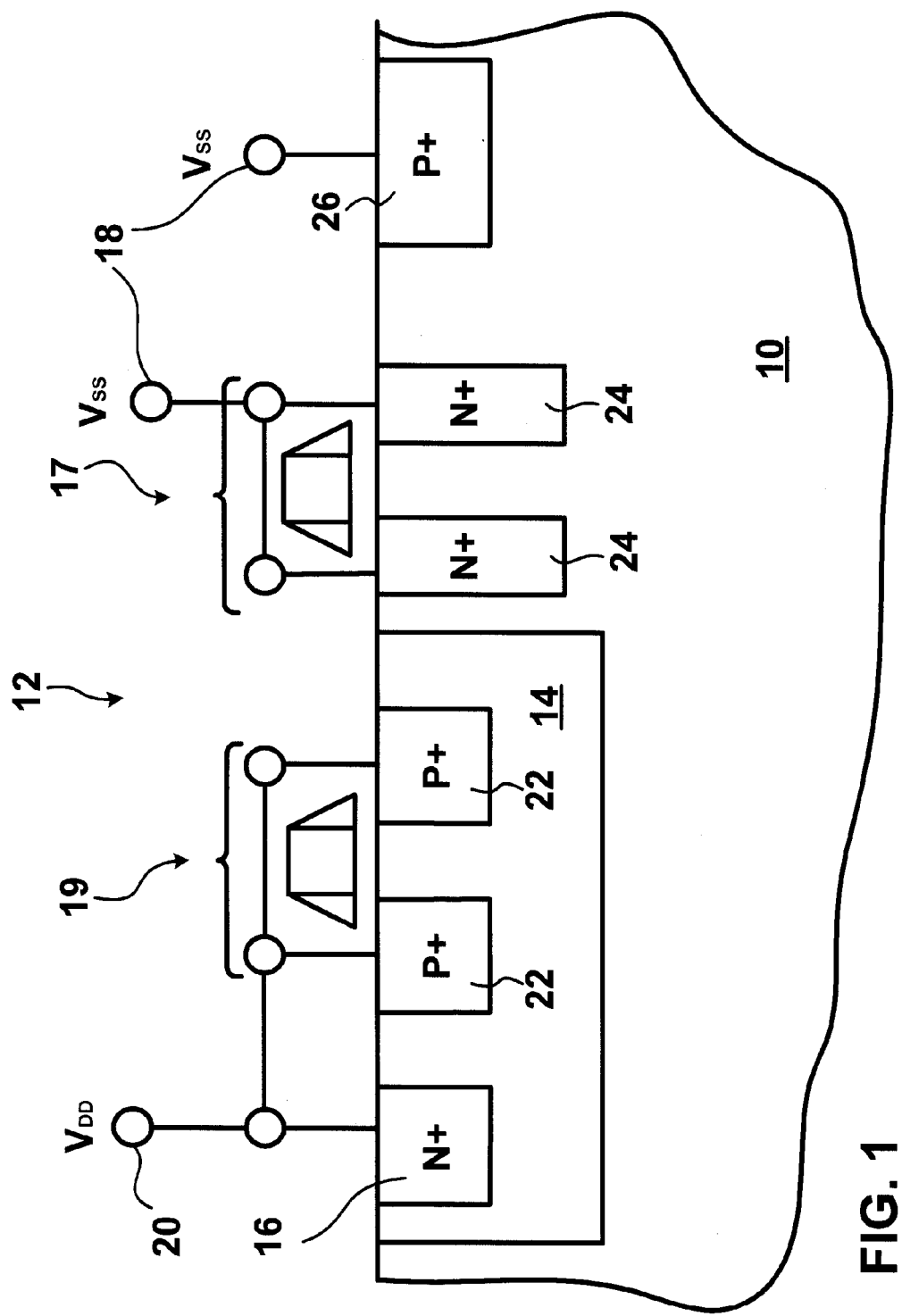
FIG. 1 is a schematic partial cross-sectional view of a prior art parasitic latchup structure environment highlighting a gate array interacting with an ESD, I/O or integrated circuit.

Referring to FIG. 1, a cross-section view of a portion of a semiconductor chip substrate 10 illustrates a gate array structure environment 12 (also referred to as gate array 12 herein) in an integrated circuit. Substrate 10 includes an n-well region 14 with a well contact 16. N-channel MOSFET 17 of gate array 12 is connected to $V_{SS}$ power rail 18. P-channel MOSFETs 19 of gate array 12 are connected to a $V_{DD}$ rail 20.

N-well region 14 may represent a diffused well, a retrograde well, a subcollector, or other vertical modulated wells. Substrate 10 may represent a p-well, a p– epi/p+ substrate, a p– wafer with a p+ buried layer, or other known substrate doping profiles.

Substrate 10 supports the integrated electronics of the integrated circuit. Located within n-well region 14 are p-doped regions 22 that form part of p-channel MOSFETs 19. Also located within substrate 10 are n-doped regions 24 that form part of n-channel MOSFETs 17. Substrate 10 also includes a substrate contact 26. It should also be noted that power ($V_{DD}$) and ground ($V_{SS}$) are applied to well contact 16 and substrate contact 26, respectively.

The structure illustrated in FIG. 1 demonstrates the ease with which a parasitic pnpn structure may be formed in either a CMOS or BiCMOS technology from the p-doped regions 22, the n-well 14, substrate 10 and n-doped regions 24. The parasitic pnpn structure may cause undesirable latchup region problems. In a gate array environment, as the substrate voltage potential increases, the n-diffusions of the MOSFET gate array forward bias discharging current to the $V_{SS}$ power rail. Additionally, a negative bias of the $V_{SS}$ substrate may lead to a forward active state of a vertical pnp.

In the above configuration, where there are connections directly to the power grid, current is able to leave the area of the I/O or ESD circuit in which it is generated and is injected into the power domain (e.g., $V_{SS}$ or $V_{DD}$) of the chip. Furthermore, allowing the injection into substrate 10 or n-well region 14 may initiate a latchup state. For example, if n-doped regions 24 are grounded and a positive pulse is applied to p-doped regions 22, latchup may occur. In further example, negative pulses may initiate a latchup between regions. In addition, a negative undershoot on substrate 10 may lead to latchup.

Figure 2:
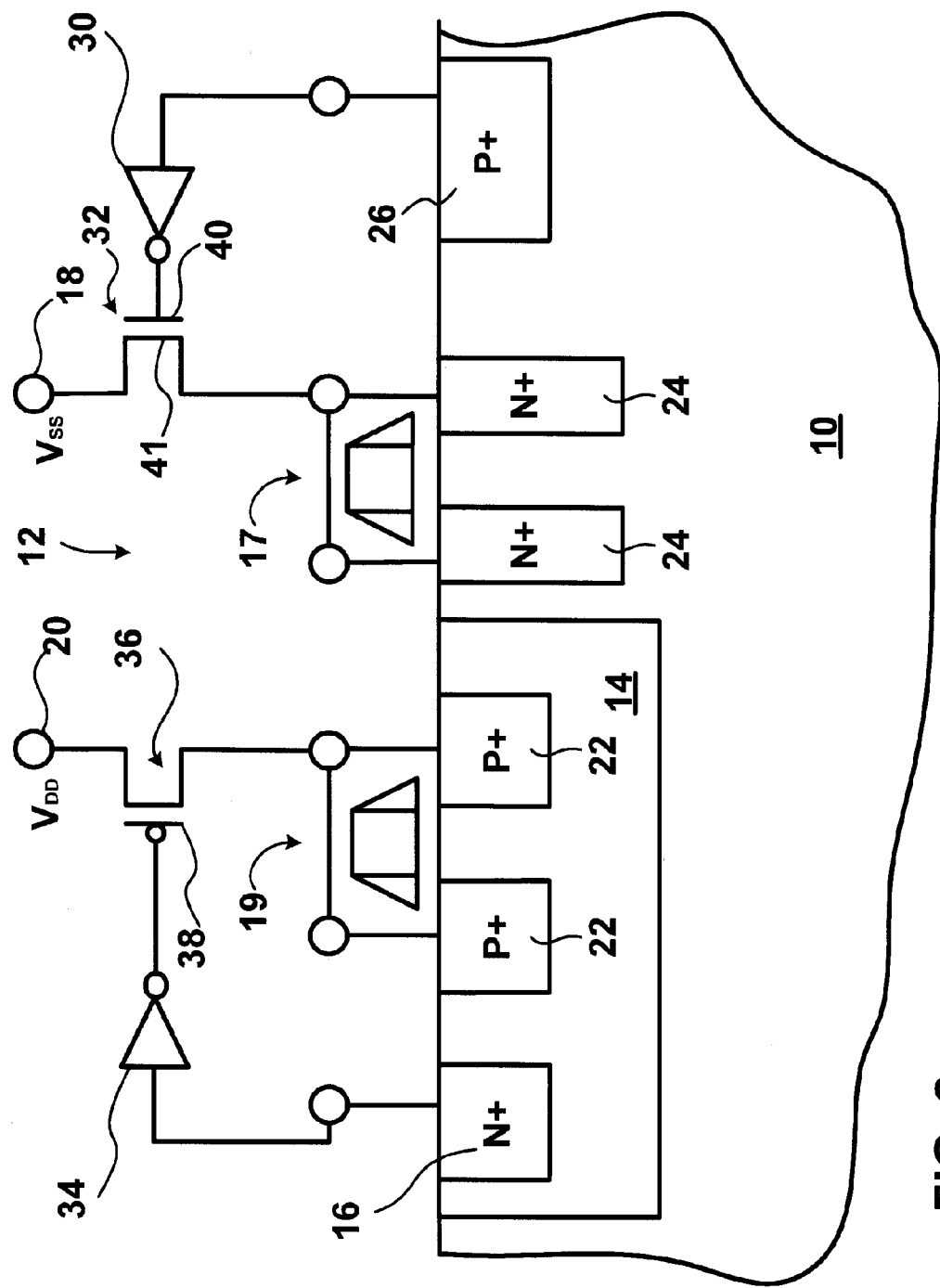
FIG. 2 is a schematic partial cross-sectional view of a cross section of a parasitic latchup structure highlighting a gate array and an integrated circuit solution according to one embodiment of the present invention.

Referring now to FIG. 2, where like elements in FIGS. 1 and 2 are indicated by like element numbers in FIG. 2, a cross-section illustrates an embodiment of an integrated circuit structure of the present invention, which is designed to counteract parasitic latchup. In FIG. 2, the n-diffusions (not illustrated) of n-channel MOSFETs 17 of gate array 12 are isolated from $V_{SS}$ power rail 18 with circuit elements 30 and 32 to prevent the forward biasing of substrate 10 relative to the n-diffusions from occurring. Equivalently, circuit elements 34 and 36 prevent p-channel MOSFETs 19 from discharging from $V_{DD}$ rail 20. P-doped region 22 is connected to circuit element 36 instead of directly to power supply voltage $V_{DD}$ 20. In FIG. 2, circuit element 34 is an inverter circuit whose input is connected to n-well contact 16, and whose output is connected to gate 38 of MOSFET element 36. In FIG. 2, n-doped region 24 is connected to circuit element 32. Circuit element 32 is located between the source and drain of MOSFET 17 and substrate power rail $V_{SS}$18. Substrate contact 26 is connected to circuit element 30. In FIG. 2, circuit element 30 is an inverter circuit whose input is connected to substrate contact 26, and whose output is connected to gate 40 of element 32.

In the embodiment illustrated in FIG. 2, perturbations to the well or substrate voltage potential are sensed by well and substrate contacts 16 and 26. This perturbation signal is then sensed on inverter circuit 30 (referred to as element 30 previously). When a perturbation signal is undesirable, leading to a latchup event, elements 30 and 32 or 34 and 36 isolate the p-channel or n-channel gate array elements, respectively, from the respective power supply rails.

Still referring to FIG. 2, substrate contact 26, a p+ type contact, is located local to substrate 10. Substrate contact 26 is then connected to a gate (not illustrated) of inverter circuit 30. As the p+ substrate contact 26 connected locally increases in potential, the output signal of inverter circuit 30 is lower. The output of inverter circuit 30 is connected to gate 40, of MOSFET circuit element 32, which functions as a gate-array latchup control element. MOSFET element 32 has a source 41 that is connected to the n+ regions 24 of MOSFET 17 of gate array 12. MOSFET element 32 is connected to $V_{SS}$. As the substrate voltage potential rises, source 41 of MOSFET circuit element 32 is turned off at its threshold voltage. The threshold voltage is a predetermined value. This then allows substrate 10 to be decoupled from VSS rail 18 and allows the diffusions to float when the substrate voltage potential inadvertently rises as a result of poor substrate grounding and injection of minority carriers. An equivalent circuit may be initiated for the p-doped regions 22 to decouple the p-doped regions and n-well contact 16 from $V_{DD}$ power supply 20.

Figure 3:
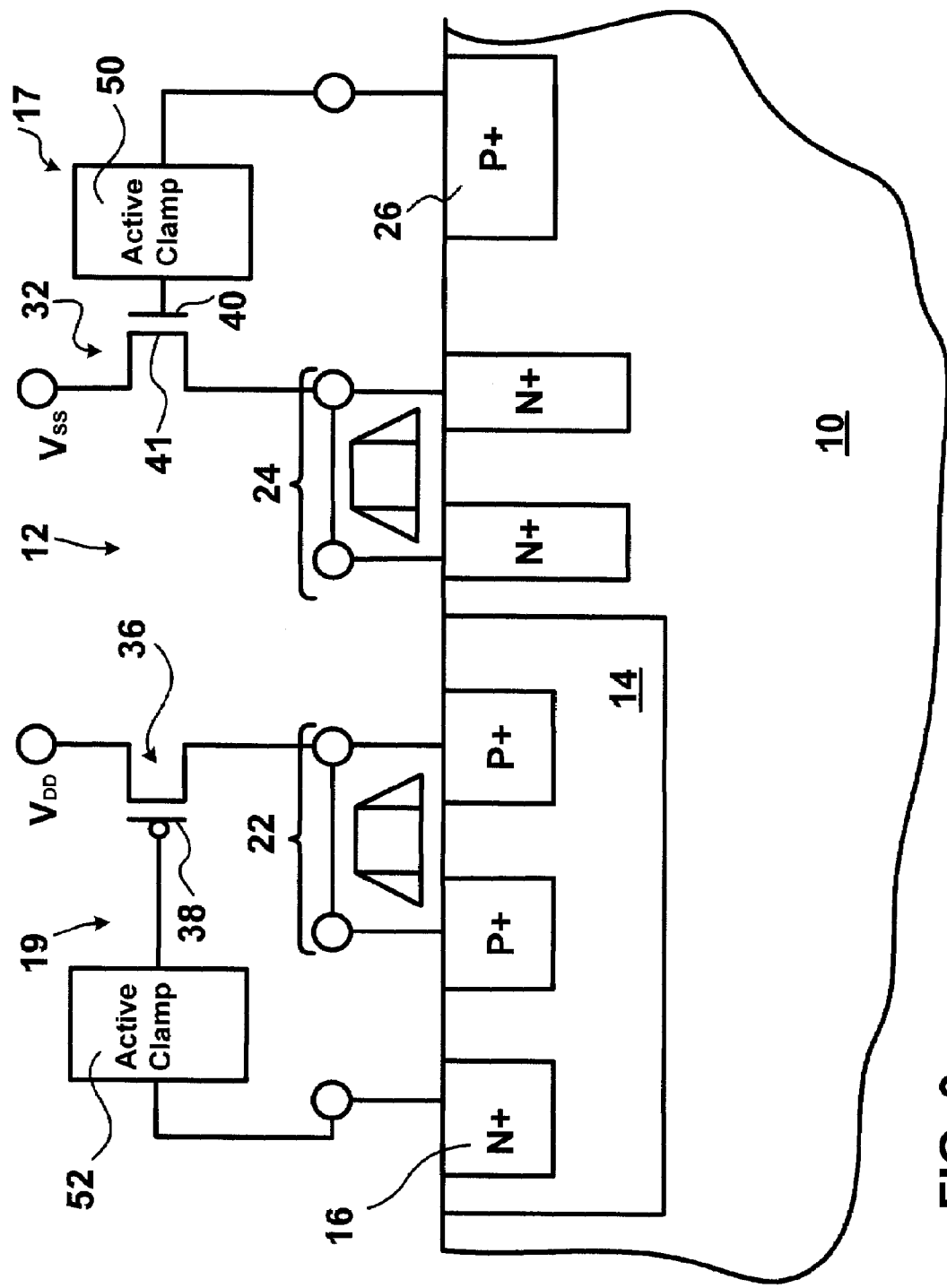
FIG. 3 is a schematic partial cross-sectional view of one embodiment according to the present invention.

Referring now to FIG. 3 where like elements between FIG. 3 and previous FIGS. are represented by like element numbers in FIG. 3, in another embodiment, active clamp networks 50 and 52 may be used in place of inverter circuit elements 30 and 34, respectively, in the embodiment illustrated in FIG. 2. As the $V_{DD}$ or $V_{SS}$ potential goes beyond the normal functional regime, active clamp networks 50 and 52 isolate $V_{SS}$ rail 18 from n-channel MOSFETs 17 and for a second state and isolates $V_{DD}$ rail 20 from the p-channel MOSFETs 19.

Active clamp networks generally have the advantage of being able to respond at any excursion outside the normal operational regime. While diode based implementations respond to excursions greater than or equal to $V_{DD}+V_{be}$, $V_{be}$ being the forward bias voltage of a junction, active clamp networks may respond to excursions greater than or equal to the $V_{DD}$ power supply voltage. Additionally, active clamp networks may also respond to voltage excursions below $V_{SS}$, instead of below $V_{SS}-V_{be}$ as in diode-based schemes. An active clamp network is designed utilizing a reference control network. This may also be referred to as a pseudo-zero VT pass transistor element.

A reference control network is used where the reference potential is set to Vtn, and a second reference control network is used whose reference potential is $V_{DD}-V_{tp}$. These references may be established using a MOSFET whose gate is coupled to its own drain connection. The network is established where a second NFET has its gate connected to reference $V_{tn}$. The network is established where a second PFET has its gate connected to a reference $V_{DD}-V_{tp}$. These control elements sense the $V_{DD}$ and substrate local potential. When the local substrate connection or the local well connection fall outside of the normal voltage range, these elements "turn on." The turn-on of these elements lead to the turning off of a transistor element between the gate array diffusions and corresponding power supplies. In the embodiment, as the substrate voltage potential increases, the signal goes below substrate (e.g., zero potential). $V_{DD}$, $V_{be}$, $V_{SS}$, and Vtp may all be predetermined values.

Figure 4:
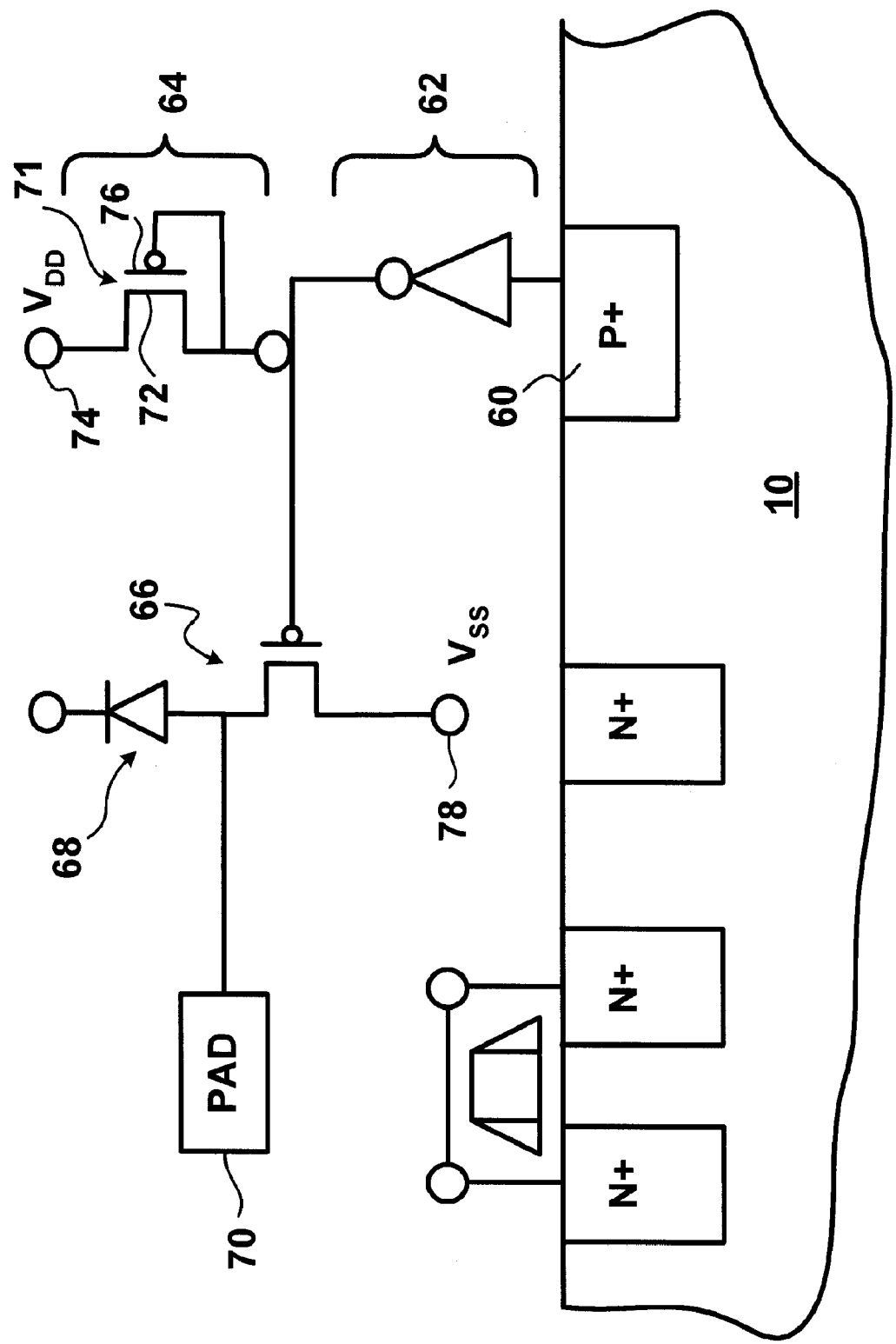
FIG. 4 is a schematic partial cross-sectional view of one embodiment according to the present invention.

Referring now to FIG. 4, another embodiment of an active clamp type network is illustrated. In FIG. 4, the active clamp type network includes a substrate contact 60, an inverter circuit 62, a reference control network 64, a MOSFET switch device 66, a diode 68, and a pad 70. Reference control network 64 includes a MOSFET 71 having a source 72 connected to $V_{DD}$ 74, and a gate (not shown) connected to its drain 76, forming a potential at $V_{DD}-V_{tp}$. When an excursion occurs in substrate 10 below pad 70, the current will flow from the pad to power rail $V_{SS}$ 78 when the pad goes below zero volts. In this case, reference control network 64 insures turn-on at the zero volt potential forming a pseudo-zero VT response. This prevents negative current injection into substrate 10 and eliminates noise injection to the substrate. When substrate 10 rises from a positive discharge or response, the signal is inverted by inverter circuit 62, turning on MOSFET switch 66. As a result, reference control network 64 addresses both an active clamp for negative excursions at pad 70, and a positive excursion from an increase in the substrate voltage potential.

Figure 5:
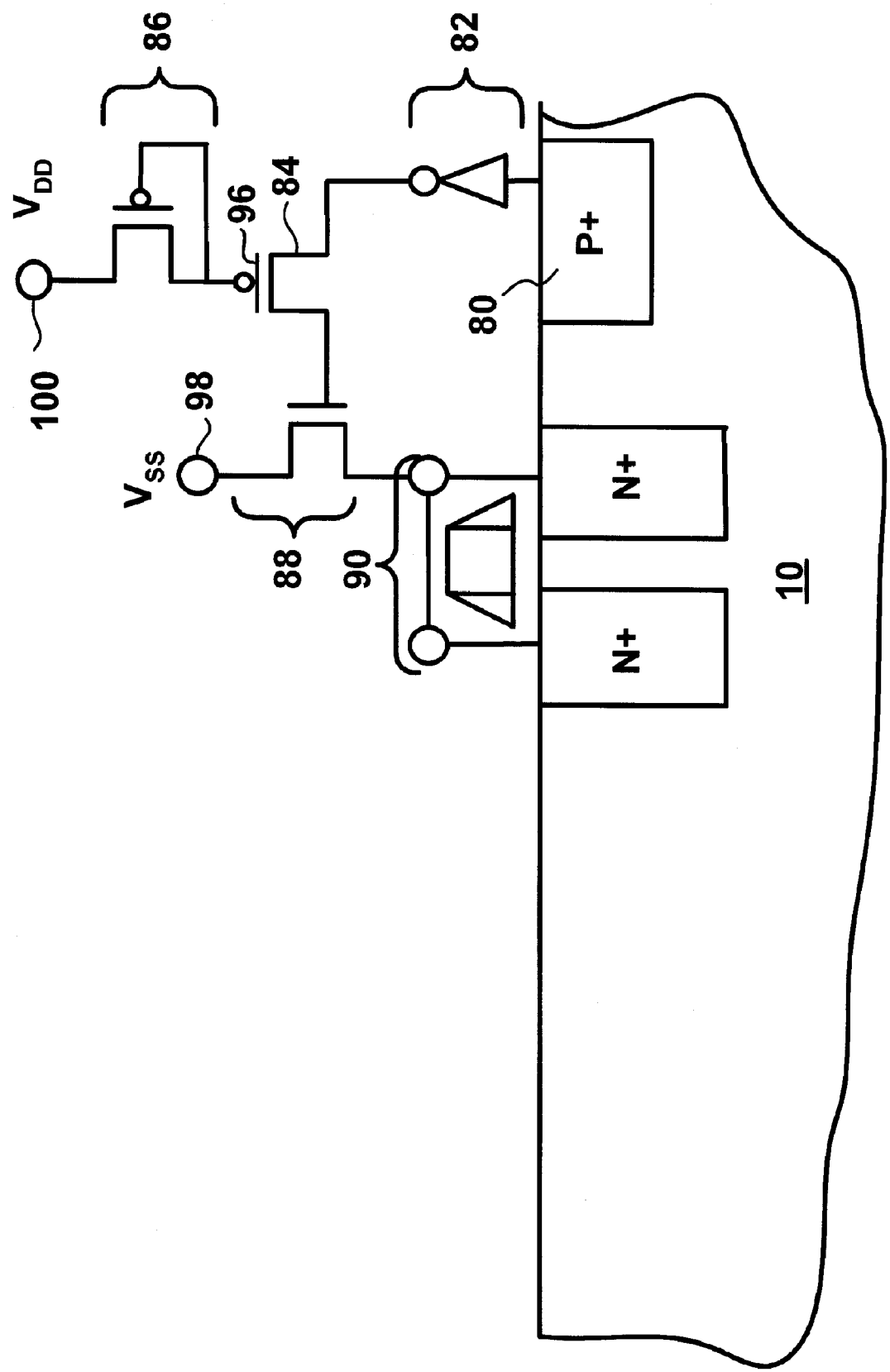
FIG. 5 is a schematic partial cross-sectional view of one embodiment according to the present invention.

FIG. 5 illustrates an embodiment which utilizes the pseudo-zero VT concept for perturbations of the substrate voltage potential local to the gate array implementation. In FIG. 5, the structure and circuit consists of a substrate 10, a p+ substrate contact 80, an inverter circuit 82, a pseudo-zero VT pass transistor 84, a gate reference control network 86, a switch 88, and a gate array element 90. The gate 96 of pass transistor 84 is connected to reference control network 86 that establishes a potential. The reference control voltage is $V_{DD}-V_{tp}$. Other embodiments to establish this potential may be established using resistor divider networks, capacitive dividers, or other configurations known to those skilled in the art for providing the voltage potential that is desired. When the potential at p+ contact 80 decreases below zero, the pseudo-zero VT half pass, transistor 84 will turn on, pulling down the gate of switch device 88, thereby isolating gate array element 90 from power supply connection $V_{SS}$ 98. An equivalent circuit may be established for the p-channel MOSFET gate array network elements, corresponding $V_{DD}$ supply 100, and reference control network 86 set at $V_{tn}$.

Figure 6:
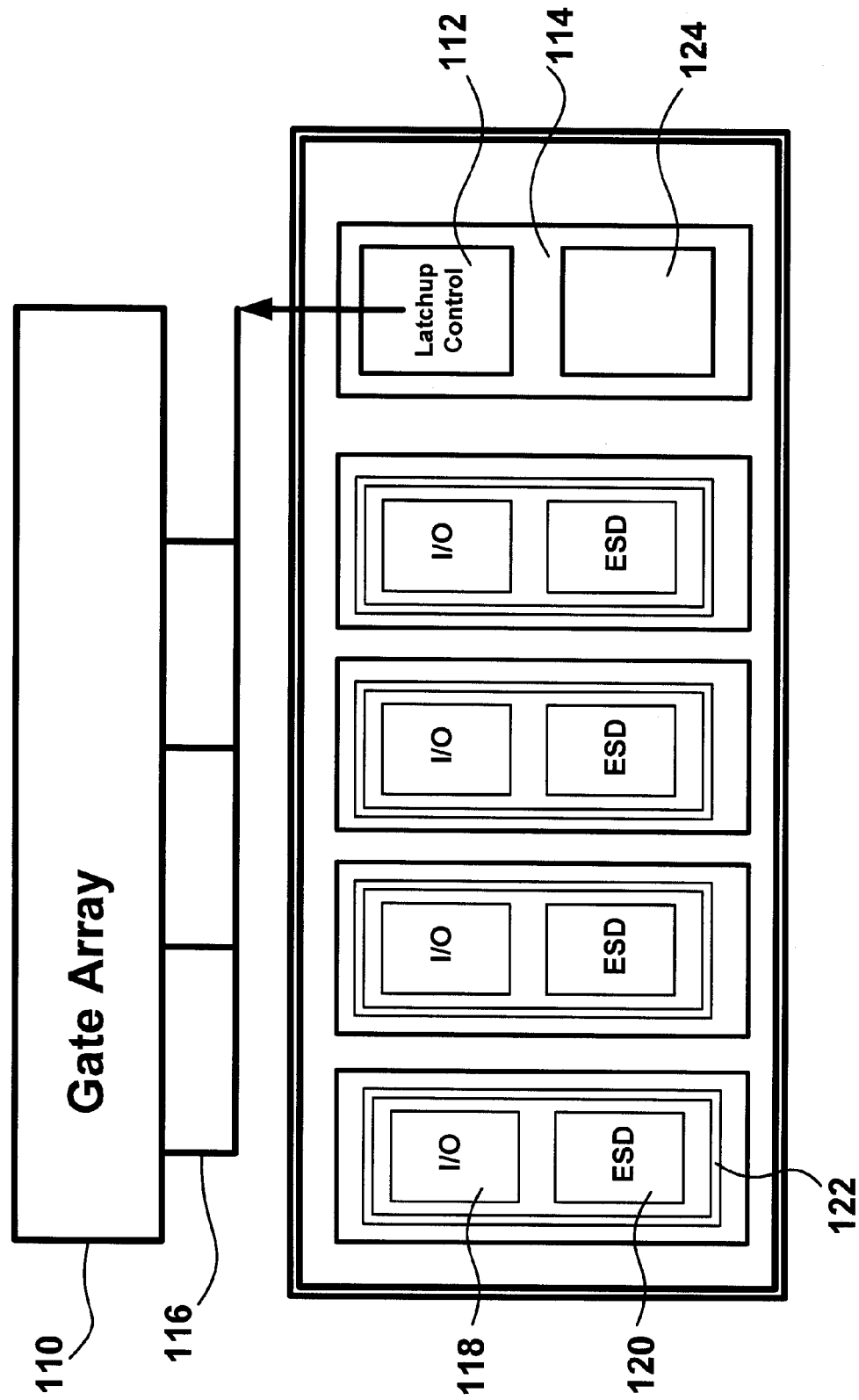
FIG. 6 is a layout schematic of one embodiment according to the the present invention.

In FIG. 6, an example of one embodiment of the present invention is illustrated. The gate array latchup control network is constructed local to the gate array itself or in a service module along a plurality of I/O elements. In this example, the structure includes an I/O network, an ESD device, a gate array, and a gate-array latchup control network.

The structure includes a gate array 110 of n-channel and p-channel MOSFET transistors joined to a latchup control function 112 contained in a service module 114 via electrical connections 116. I/O cell MOSFETs 118 and ESD elements 120 are contained in peripheral circuits 122 of the semiconductor chips. Service module 114 may contain other circuit function and logic 124. The substrate contacts and well contacts (not illustrated) are local to the gate array elements as shown in FIGS. 1–5. Electrical connections of the latchup control networks, references, and other support circuit may be placed in (consistent terminology) service module 114 to provide the necessary controls for the bank of gate arrays adjacent or local to I/O and ESD elements 118 and 120.

As the substrate and well potentials are disturbed from the I/O or ESD cell injection, the substrate sensing may decouple gate array elements 110 according to the embodiments illustrated in FIGS. 2–5.

Figure 7:
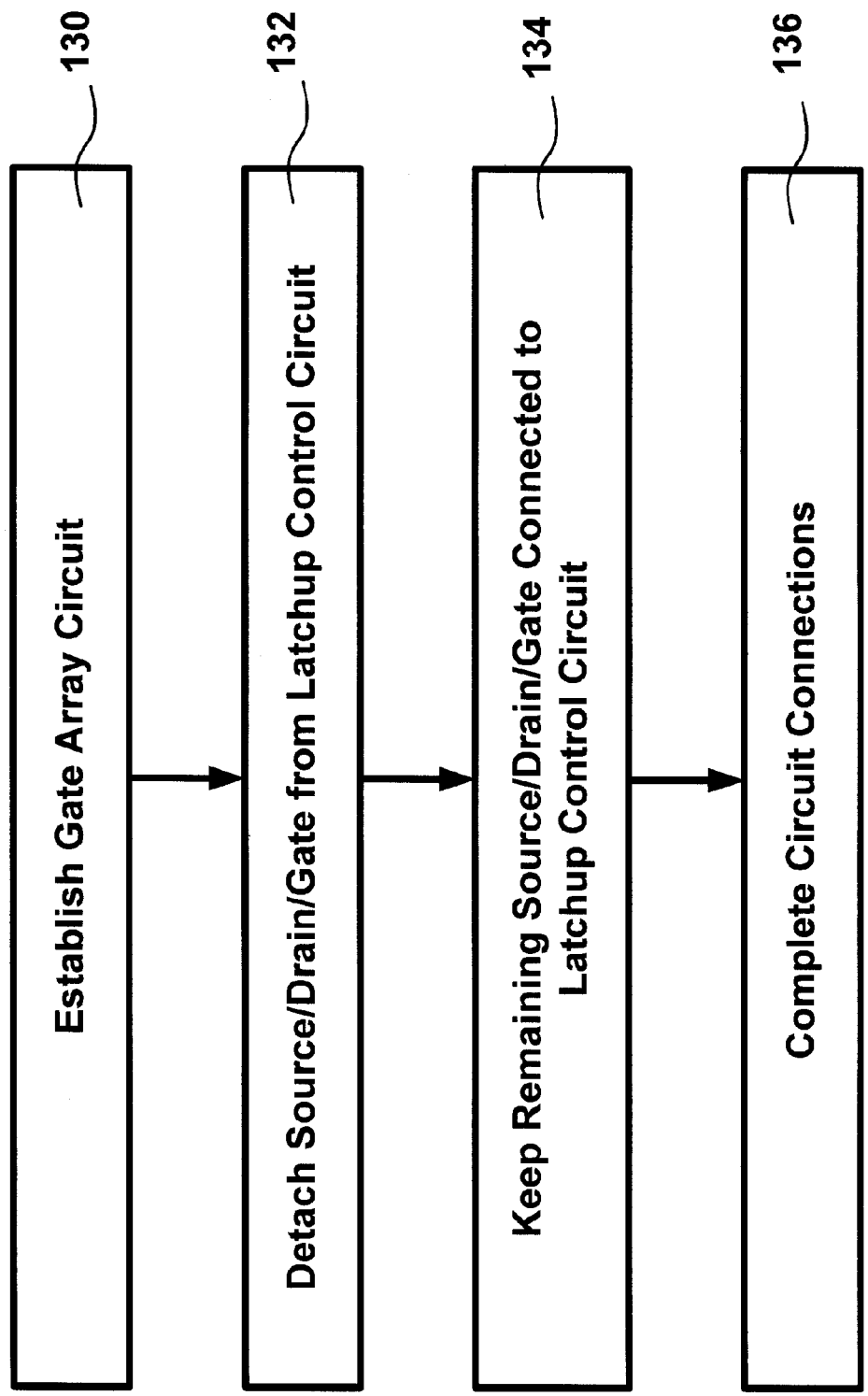
FIG. 7 is a block diagram of methodology according to one embodiment of the present invention.

In FIG. 7, a block diagram illustrates the steps of a method according to one embodiment of the present invention. The system illustrated in FIG. 7 includes a methodology that allows for the customization of the "sea of gates" by disconnection of the n-regions from the gate array latchup control network as these elements are utilized in circuits. Such a methodology may include forming a sea of gates, forming a latchup gate array control network, forming a ESD network, forming a I/O cell, and providing a means of isolating said gates from said latchup gate array control network for personalization and customization of an integrated circuit.

As illustrated in FIG. 7, in the system's first step 130, the gate array circuit is identified and established. When the gate array region is identified, the source, drain and gate are separated from the power supplies is established at step 132. Then, the electrical connections which are directly connected to the $V_{DD}$ or $V_{SS}$ may be connected to the latchup control circuit at step 134. Finally, at step 136, the circuit electrical connections are established.

Typically, only elements close to the substrate or well injection are decoupled from the $V_{DD}$ and $V_{SS}$ power supplies. Regions of the semiconductor chip far from injection sources may not require isolation of these elements to avoid latchup. Minority carrier injections may diffuse from the injection source location, providing potential disturbances and injection into the substrate or n-well regions and initiating latchup. In this case, as part of the system illustrated in FIG. 7, a distance is defined based on known injection source regions. For example, the decoupling of the gate array elements may be applied to gate array elements from a certain distance from the injection source. In chip design, the injection sources (e.g., I/O cell and ESD elements) may be defined according to the relative distance from these elements to the latchup prone elements. The detachment of the source, drain, and gate electrodes may be applied to a certain distance. From the known size of the injection source input, and relative placement, the magnitude of the current and potential may be determined at the gate array element. In this manner, a heuristic or metric may be defined to decide how far the method of detachment is applied and which gate array block items are reconnected to the latchup control circuitry function. For example, electron recombination is a function of the electron diffusion length. The electron diffusion length is dependent on the diffusion coefficient and the electron recombination time. The electron recombination time is inversely proportional to the doping concentration of the substrate.

While the present invention has been described in connection with specified embodiments, it will be understood that it is not so limited. On the contrary, it is intended to cover all alternatives, modifications and equivalents as may be included within the spirit and scope of the invention as defined in the appended claims.

The invention claimed is:

1. An integrated circuit comprising:
a substrate;
a power rail;
sea of gates; and
a latchup control isolation network electrically coupled to said substrate and positioned in series between said power rail and said sea of gates so as to receive perturbations in voltage potential in said substrate arising from latchup events in said substrate, said latchup control isolation network adapted to electrically isolate said sea of gates from said power rail in response to undesirable perturbations in said voltage potential in said substrate.

2. An integrated circuit according to claim 1, wherein said substrate has a first polarity, the circuit further including a well having a second polarity, further wherein said latchup control isolation network is also electrically coupled to said well and is positioned in series between said power rail and said sea of gates so as to receive perturbations in voltage potential in said well arising from latchup events in said well, said latchup control isolation network adapted to electrically isolate said sea of gates from said power rail in response to undesirable perturbations in said voltage potential in at least one of said substrate and said well.

3. An integrated circuit according to claim 2, wherein said latchup control isolation network turns off thereby isolating said sea of gates from said power rail when said voltage potential in one or both of said substrate and said well equals or is greater than a first predetermined value or said voltage potential equals or is less than a second predetermined value.

4. An integrated circuit according to claim 1, further including a well, wherein said power rail includes a VDD power rail and a VSS power rail and said latchup control isolation network includes a first FET with a first polarity type channel in said well and connected to said VDD rail and a second FET with a second polarity type channel connected to said VSS rail and said substrate.

5. An integrated circuit according to claim 4, wherein said first FET is a p-channel MOSFET and said second FET is a n-channel MOSFET.

6. An integrated circuit according to claim 1, wherein said latchup control isolation network includes an inverter circuit.

7. An integrated circuit comprising:
a substrate;
a power rail;
a sea of gates; and
an active clamp network electrically coupled to said substrate and positioned in series between said power rail and said sea of gates so as to receive perturbations in voltage potential in said substrate arising from latchup events in said substrate, said active clamp network adapted to electrically isolate said sea of gates from said power rail in response to undesirable perturbations in said voltage potential on said substrate.

8. An integrated circuit according to claim 7, wherein said substrate has a first polarity, the circuit further including a well having a second polarity, further wherein said latchup control isolation network is also electrically coupled to said well and is positioned in series between said power rail and said sea of gates so as to receive perturbations in voltage potential in said well arising from latchup, events in said well, said latchup control isolation network adapted to electrically isolate said sea of gates from said power rail in response to undesirable perturbations in said voltage potential on at least one of said substrate and said well.

9. An integrated circuit according to claim 8, wherein said active clamp network turns off thereby isolating said sea of gates from said power rail when said voltage potential in one or both of said substrate and said well equals or is greater than a first predetermined value or said voltage potential equals or is less than a second predetermined value.

10. An integrated circuit according to claim 9, wherein said first predetermined value is $V_{DD}$.

11. An integrated circuit according to claim 9, wherein said second predetermined value is $V_{SS}$.

12. A method of suppressing latchup in an integrated circuit in a substrate, said circuit having a sea of gates and a power rail, comprising the steps of:
   electrically connecting one of a latchup control isolation network and an active clamp network to the substrate in series between the sea of gates and the vower rail and to receive charges in voltage potential in the substrate arising from latchup events on the substrate; and
   turning off said latchup control isolation network, when connected in said prior step, or turning on said active clamp network, when connected in said prior step, thereby isolating the power rail from the sea of gates in response to latchup events on said substrate.

13. A method according to claim 12, further comprising the steps of:
   providing a substrate having a first polarity, the circuit further including a well having a second polarity, further wherein said latchup control isolation network is also electrically coupled to said well and is positioned in series between the power rail and the sea of gates so as to receive changes in voltage potential in said well arising from latchup events in said well, said latchup control isolation network adapted to electrically isolate said sea of gates from said power rail in response to latchup events on at least one of said substrate and said well.

14. A method according to claim 13, wherein if said latchup control isolation network is connected in said electrically connecting step, said latchup control isolation network is turned off thereby isolating said sea of gates from said power nil when either said voltage potential equals or is greater than a first predetermined value or said voltage potential equals or is less than a second predetermined value.

15. A method according to claim 14, wherein said first predetermined value is $V_{DD}+V_{bc}$.

16. A method according to claim 14, wherein said second predetermined value is $V_{SS}-V_{be}$.

17. A method according to claim 13, wherein if said latchup control isolation network is connected in said electrically connecting step, said active clamp network is turned off thereby isolating said sea of gates from said power rail when either said voltage potential equals or is greater than a first predetermined value or said voltage potential equals or is less than a second predetermined value.

18. A method according to claim 17, wherein said first predetermined value is $V_{DD}$.

19. A method according to claim 17, wherein said second predetermined value is $V_{SS}$.

* * * * *